United States Patent
Ueki et al.

(10) Patent No.: US 9,106,313 B2
(45) Date of Patent: Aug. 11, 2015

(54) IMPEDANCE CONVERSION CIRCUIT AND COMMUNICATION TERMINAL APPARATUS

(71) Applicant: Murata Manufacturing Co., Ltd., Nagaokakyo-shi, Kyoto-fu (JP)

(72) Inventors: Noriyuki Ueki, Nagaokakyo (JP); Noboru Kato, Nagaokakyo (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 14/072,817

(22) Filed: Nov. 6, 2013

(65) Prior Publication Data

US 2014/0065980 A1     Mar. 6, 2014

Related U.S. Application Data

(63) Continuation of application No. PCT/JP2012/061592, filed on May 2, 2012.

(30) Foreign Application Priority Data

May 9, 2011 (JP) .................. 2011-103972

(51) Int. Cl.
*H04B 1/04* (2006.01)
*H04B 1/40* (2015.01)
(Continued)

(52) U.S. Cl.
CPC ............... *H04B 1/40* (2013.01); *H01F 19/04* (2013.01); *H03H 7/38* (2013.01); *H04B 1/0458* (2013.01);
(Continued)

(58) Field of Classification Search
CPC ........... H03H 7/38; H03H 7/383; H03H 7/09; H03H 2007/386; H04B 1/0458; H01F 19/04

USPC ............. 455/121, 132, 150.1, 227, 275, 290, 455/292, 193.1, 193.2
See application file for complete search history.

(56) References Cited

U.S. PATENT DOCUMENTS 5,113,195 A * 5/1992 Sakurai et al. ................ 343/704
5,258,728 A * 11/1993 Taniyoshi et al. ............ 333/132
(Continued)

FOREIGN PATENT DOCUMENTS

JP    2-261209 A    10/1990
JP    02-261209 A    10/1990
(Continued)

OTHER PUBLICATIONS

Official Communication issued in International Patent Application No. PCT/JP2012/061592, mailed on Jul. 10, 2012.
(Continued)

*Primary Examiner* — Duc M Nguyen
(74) *Attorney, Agent, or Firm* — Keating & Bennett, LLP

(57) ABSTRACT

In an impedance conversion circuit, since, in a low band, an absolute value of impedance of a primary side coil is smaller than an absolute value of impedance of a capacitor, a high-frequency signal in a low band propagates through a transformer. Thus, impedance matching of a high-frequency signal in a low band is performed by the transformer. Since, in a high band, the absolute value of the impedance of the capacitor is smaller than the absolute value of the impedance of the primary side coil, a high-frequency signal in a high band propagates through the capacitor. Thus, impedance matching of a high-frequency signal in a high band is performed in the capacitor. Accordingly, impedance matching between a high frequency circuit and an antenna element is performed in a wide frequency band.

14 Claims, 16 Drawing Sheets

(51) Int. Cl.
*H01F 19/04* (2006.01)
*H03H 7/38* (2006.01)
*H03H 7/09* (2006.01)
*H03H 1/00* (2006.01)
*H01F 27/28* (2006.01)

(52) U.S. Cl.
CPC .......... *H01F 2027/2809* (2013.01); *H03H 7/09* (2013.01); *H03H 2001/0085* (2013.01); *H03H 2007/386* (2013.01)

(56) References Cited

U.S. PATENT DOCUMENTS

| | | | |
|---|---|---|---|
| 5,781,160 A * | 7/1998 | Walton | 343/713 |
| 5,945,957 A * | 8/1999 | Kakizawa | 343/713 |
| 6,229,493 B1 * | 5/2001 | Iijima | 343/713 |
| 2001/0054981 A1 | 12/2001 | Boyle | |
| 2003/0030994 A1 | 2/2003 | Takaya et al. | |
| 2009/0291661 A1 | 11/2009 | Oishi et al. | |
| 2010/0109967 A1 | 5/2010 | Ranta | |
| 2014/0055209 A1* | 2/2014 | Ishizuka et al. | 333/129 |
| 2014/0062817 A1* | 3/2014 | Ishizuka et al. | 343/745 |
| 2014/0065980 A1* | 3/2014 | Ueki et al. | 455/73 |
| 2014/0078014 A1* | 3/2014 | Kato et al. | 343/860 |

FOREIGN PATENT DOCUMENTS

| | | |
|---|---|---|
| JP | 03-080509 A | 4/1991 |
| JP | 3-80509 A | 4/1991 |
| JP | 2000-068878 A | 3/2000 |
| JP | 2000-68878 A | 3/2000 |
| JP | 2001-36328 A | 2/2001 |
| JP | 2001-036328 A | 2/2001 |
| JP | 2002-158135 A | 5/2002 |
| JP | 2003-536338 A | 12/2003 |
| JP | 2008-118535 A | 5/2008 |
| JP | 2009-284429 A | 12/2009 |
| JP | 2010-510706 A | 4/2010 |
| JP | 2012-084833 A | 4/2012 |
| JP | 2012-085250 A | 4/2012 |
| JP | 2012-085305 A | 4/2012 |

OTHER PUBLICATIONS

Official Communication issued in corresponding Japanese Patent Application No. 2013-513999, mailed on Sep. 24, 2014.

Ono, K. et al., "Electric Circuits (1) Underdgraduate Course"; Mar. 3, 2004; 3rd Edition; pp. 94, 95, 98-99.

* cited by examiner

IMPEDANCE CONVERSION CIRCUIT AND COMMUNICATION TERMINAL APPARATUS

BACKGROUND OF THE INVENTION

1. Field of the Invention

The present invention relates to an impedance conversion circuit preferably for use in an antenna device and other devices. In particular, the present invention relates to an impedance conversion circuit that provides matching in a wide frequency band, and to a communication terminal apparatus equipped with the impedance conversion circuit.

2. Description of the Related Art

In recent years, communication terminal apparatuses, such as mobile phones, may require compatibility with communication systems, such as a GSM (registered trademark) (Global System for Mobile communication), DCS (Digital Communication System), PCS (Personal Communication Services), and UMTS (Universal Mobile Telecommunications System), as well as a GPS (Global Positioning System), a wireless LAN, Bluetooth (registered trademark), and the like. Thus, antenna devices for such communication terminal apparatuses are required to cover a wide frequency band of 800 MHz to 2.4 GHz.

Antenna devices for a wide frequency band typically have a matching circuit for each frequency band (PCT Japanese Translation Patent Publication No. 2003-536338), and switch an electrical length of an antenna with an active element (Japanese Unexamined Patent Application Publication No. 2008-118535).

However, in the antenna devices disclosed in PCT Japanese Translation Patent Publication No. 2003-536338 and Japanese Unexamined Patent Application Publication No. 2008-118535, since it is necessary to design the antenna pattern for every terminal, the antenna design becomes time consuming; and since such antenna devices also require an active element such as a switching circuit in order to switch a signal path, the circuit configuration is likely to be complicated.

SUMMARY OF THE INVENTION

In view of the circumstances described above, preferred embodiments of the present invention provide an impedance conversion circuit capable of being comparatively easily designed, and capable of impedance matching between a high frequency circuit and an antenna element in a wide frequency band with a simple configuration; and a communication terminal apparatus equipped with the impedance conversion circuit.

An impedance conversion circuit according to a preferred embodiment of the present invention is an impedance conversion circuit preferably for use in an antenna device that transmits and receives a high-frequency signal in a frequency band including a first frequency band and a second frequency band of which a frequency band is higher than the first frequency band, and the impedance conversion circuit includes a transformer that includes a primary side coil and a secondary side coil and is connected between a feeding port and an antenna port; and a capacitor that is connected between the feeding port and the antenna port, wherein an absolute value of impedance of the capacitor in the first frequency band is larger than an absolute value of impedance of the primary side coil, and an absolute value of impedance of the capacitor in the second frequency band is smaller than the absolute value of the impedance of the primary side coil.

A communication terminal apparatus according to a preferred embodiment of the present invention is a communication terminal apparatus that includes an antenna device that transmits and receives a high-frequency signal in a frequency band including a first frequency band and a second frequency band of which a frequency band is higher than the first frequency band, the communication terminal apparatus including an impedance conversion circuit including a transformer that is connected between a feeding port and an antenna port and includes a primary side coil and a secondary side coil; and a capacitor that is connected between the feeding port and the antenna port, wherein an absolute value of impedance of the capacitor in the first frequency band is larger than an absolute value of impedance of the primary side coil, and an absolute value of impedance of the capacitor in the second frequency band is smaller than the absolute value of the impedance of the primary side coil.

An impedance conversion circuit according to a preferred embodiment of the present invention performs impedance matching between an antenna element and a high frequency circuit over a wide band with a simple configuration, and is comparatively easily designed.

In addition, a communication terminal apparatus according to a preferred embodiment of the present invention is easily applied to various communication systems having different frequency bands.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
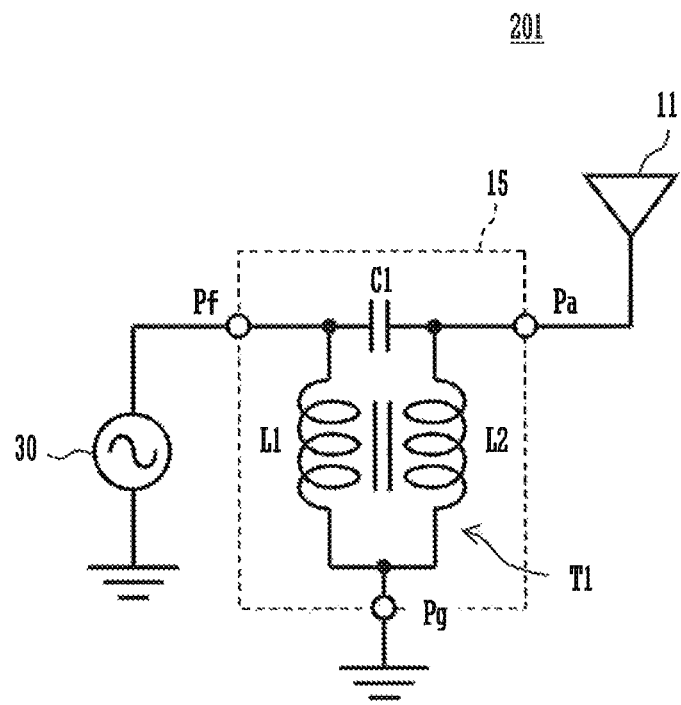
FIG. 1 is a circuit diagram of an impedance conversion circuit 15 according to a first preferred embodiment of the present invention and an antenna device 201 equipped with the impedance conversion circuit 15.

FIG. 1 is a circuit diagram of an impedance conversion circuit 15 according to a first preferred embodiment of the present invention and an antenna device 201 equipped with the impedance conversion circuit 15. As illustrated in FIG. 1, the antenna device 201 includes an antenna element 11 and the impedance conversion circuit 15 connected to the antenna element 11. The antenna element 11 preferably is a monopole antenna, for example, and the impedance conversion circuit 15 is connected to a feeding end of the antenna element 11. The impedance conversion circuit 15 is inserted between the antenna element 11 and a high frequency circuit 30. The high frequency circuit 30 is a high frequency circuit (a feeding circuit) that feeds a high-frequency signal to the antenna element 11, generates or processes the high-frequency signal, and may include a circuit that multiplexes and demultiplexes the high-frequency signal.

The impedance conversion circuit 15 includes a high frequency transformer T1 defined by a primary side coil L1 and a secondary side coil L2, and a capacitor C1. The primary side coil L1 is connected between a feeding port Pf and a ground port Pg. Specifically, the first end of the primary side coil L1 is connected to the feeding port Pf, and the second end of the primary side coil L1 is connected to ground. The secondary side coil L2 is connected between an antenna port Pa and the ground port Pg. Specifically, the first end of the secondary side coil L2 is connected to the antenna port Pa, and the second end of the secondary side coil L2 is connected to the ground. In addition, the capacitor C1 is connected between the feeding port Pf and the antenna port Pa. The impedance conversion ratio of the transformer T1 is the ratio between the inductance of the primary side coil L1 and the inductance of the secondary side coil L2.

For the communication bands of mobile communication terminals, for example, a penta-band (GSM (registered trademark) 850, GSM (registered trademark) 900, DCS, PCS, W-CDMA (UMTS)) has two frequency bands: the first frequency band 824 MHz to 960 MHz (hereinafter referred to simply as an 800 MHz band: a low band); and the second frequency band 1710 MHz to 2170 MHz (hereinafter referred to simply as a 2 GHz band: a high band).

In a low band, the absolute value of the impedance (capacitive reactance: XC) of the capacitor C1 is greater than the absolute value of the impedance (inductive reactance: XL) of the primary side coil L1. In addition, in a high band, the absolute value of the impedance (capacitive reactance: XC) of the capacitor C1 is smaller than the absolute value of the impedance (inductive reactance: XL) of the primary side coil L1.

Figure 2A:
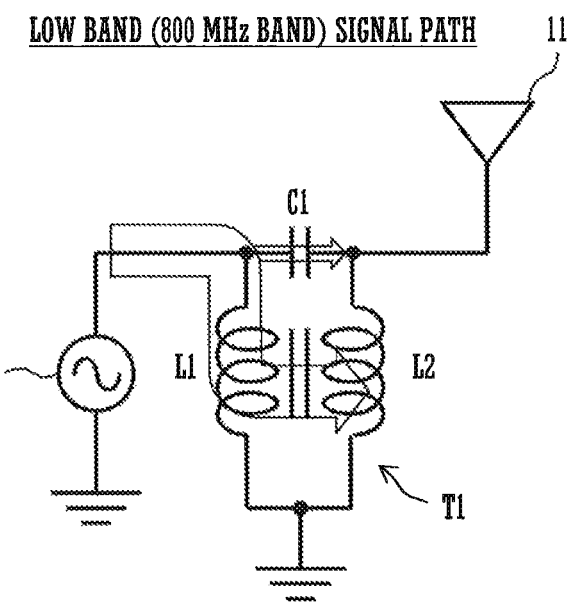
FIG. 2A and FIG. 2B are views illustrating a propagation path of a signal by a difference in frequency band.
Figure 2B:
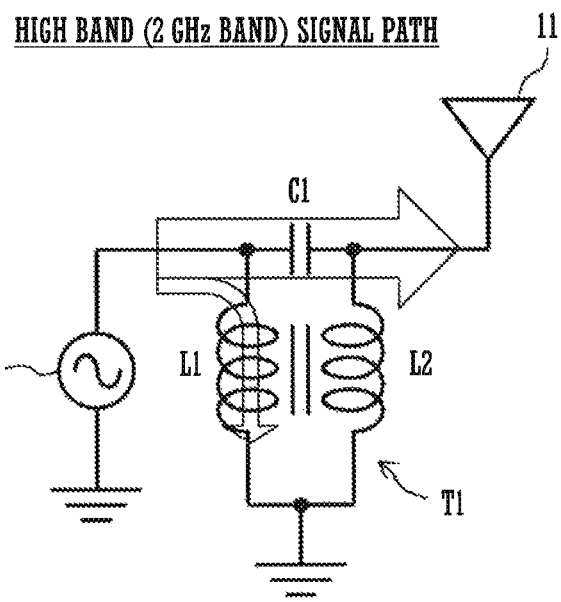

FIG. 2A and FIG. 2B are views illustrating a propagation path of a signal by a difference in frequency band. Since, in a low band, the absolute value of the impedance (inductive reactance: XL) of the primary side coil L1 is smaller than the absolute value of the impedance (capacitive reactance: XC) of the capacitor C1, a high-frequency signal in a low band propagates through the transformer T1. FIG. 2A illustrates the propagation path of a high-frequency signal of this low band. Thus, the impedance matching of a high-frequency signal in a low band is performed in the transformer T1. For example, if the impedance (the absolute value) of the antenna element 11 in a low band is 8Ω, and the impedance as viewed from the feeding port Pf to the high frequency circuit 30 side is 50Ω, the impedance conversion ratio in the transformer T1 is determined to be 50:8. Accordingly, the impedance matching between the high frequency circuit 30 and the antenna element 11 is performed in a low band.

In a similar way, since, in a high band, the absolute value of the impedance (capacitive reactance: XC) of the capacitor C1 is smaller than the absolute value of the impedance (inductive reactance: XL) of the primary side coil L1, a high-frequency signal in a high band propagates through the capacitor C1. FIG. 2B illustrates the propagation path of a high-frequency signal of this high band. Thus, the impedance matching of a high-frequency signal in a high band is performed in the series-connected capacitor C1. For example, the impedance (the absolute value) of the antenna element 11 in a high band is 26Ω and is matched to 50Ω with the series inductance component of the antenna element 11 and the series capacitance of the capacitor C1.

In this way, appropriate impedance matching is performed in a wide band for both a low band and a high band.

Figure 3A:
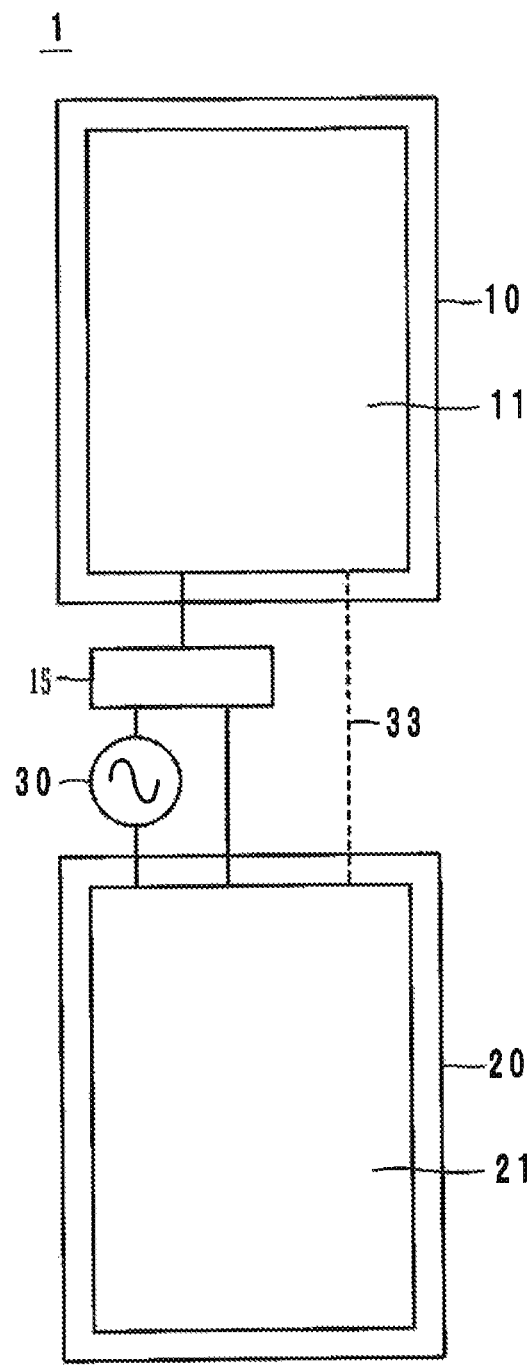
FIG. 3A is a configuration diagram illustrating a first example of a communication terminal apparatus equipped with an impedance conversion circuit.
Figure 3B:
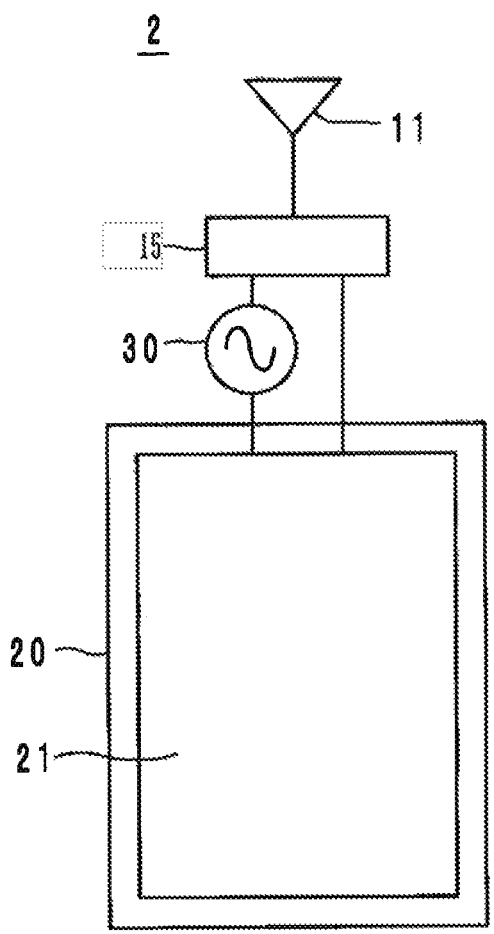
FIG. 3B is a configuration diagram illustrating a second example of a communication terminal apparatus.

FIG. 3A is a configuration diagram illustrating a first example of a communication terminal apparatus equipped with the impedance conversion circuit, and FIG. 3B is a configuration diagram illustrating a second example of a communication terminal apparatus, which may include, for example, portable phones and mobile terminals.

A communication terminal apparatus 1 as illustrated in FIG. 3A includes a first casing 10 as a cover portion and a second casing 20 as a main portion. The first casing 10 is coupled to the second casing 20 in a flipping or sliding manner. The first casing 10 includes a first radiating element 11 that also functions as a ground plate, and the second casing 20 includes a second radiating element 21 that also functions as a ground plate. The first and second radiating elements 11 and 21 are preferably made of a conductive film that is a thin film such as a metal foil or a thick film made of conductive paste. The first and second radiating elements 11 and 21 are subjected to differential feeding from a high frequency circuit 30 so as to have performance similar to the performance of a dipole antenna. The high frequency circuit 30 includes a signal processing circuit such as an RF circuit or a baseband circuit.

It is to be noted an inductance value of the impedance conversion circuit 15 is preferably smaller than an inductance value of a connection line 33 that connects the two radiating elements 11 and 21. For this reason, since the impedance passing through the impedance conversion circuit 15 becomes lower than the impedance on the side of the connection line 33, current mainly flows on the side of the impedance conversion circuit 15. Therefore, the effect of the impedance on the side of the connection line 33 is significantly reduced or prevented.

A communication terminal apparatus 2 illustrated in FIG. 3B includes the first radiating element 11 alone as an antenna. The first radiating element 11 may include various antenna elements such as a chip antenna, a sheet-metal antenna, and a coil antenna, for example. Alternatively, as this antenna element, for example, a linear conductor arranged along an inner peripheral surface or an outer peripheral surface of the casing may be used. The second radiating element 21 also functions as a ground plate for the second casing 20, and may include various antennas as in the first radiating element 11. Incidentally, the communication terminal apparatus 2 preferably is not a flip type or a slide type but a straight-structure terminal. It should be noted the second radiating element 21 does not necessarily have to function as a radiator, and the first radiating element 11 may operate as a so-called monopole antenna.

The feeding circuit 30 is connected at one end to the second radiating element 21, and connected at the other end to the first radiating element 11 through the impedance conversion circuit 15.

The impedance conversion circuit 15 is provided between the feeding circuit 30 and the first radiating element 11, and stabilizes the frequency characteristics of high-frequency signals transmitted from the first and second radiating elements 11 and 21 or high-frequency signals received by the first and second radiating elements 11 and 21. Thus, the frequency characteristics of the high-frequency signals are stabilized without being affected by the shapes of the first and second radiating elements 11 and 21, the shapes of the first casing 10 and the second casing 20, the arrangement of neighboring components, and the like. In particular, in the flip-type or slide-type communication terminal apparatus, the impedances of the first and second radiating elements 11 and 21 are likely to change depending on the opening/closing state of the first casing 10 as a cover portion with respect to the second casing 20 as a main portion. However, by providing the impedance conversion circuit 15, the frequency characteristics of high-frequency signals are stabilized. Specifically, the impedance conversion circuit 15 can have frequency characteristic adjustment functions such as setting of a center frequency, setting of a pass-band width, and setting of impedance matching that are important for antenna design, so that, for the antenna elements, it is only necessary to take mainly the directivity and gain into consideration, which can simplify the antenna design.

Figure 4:
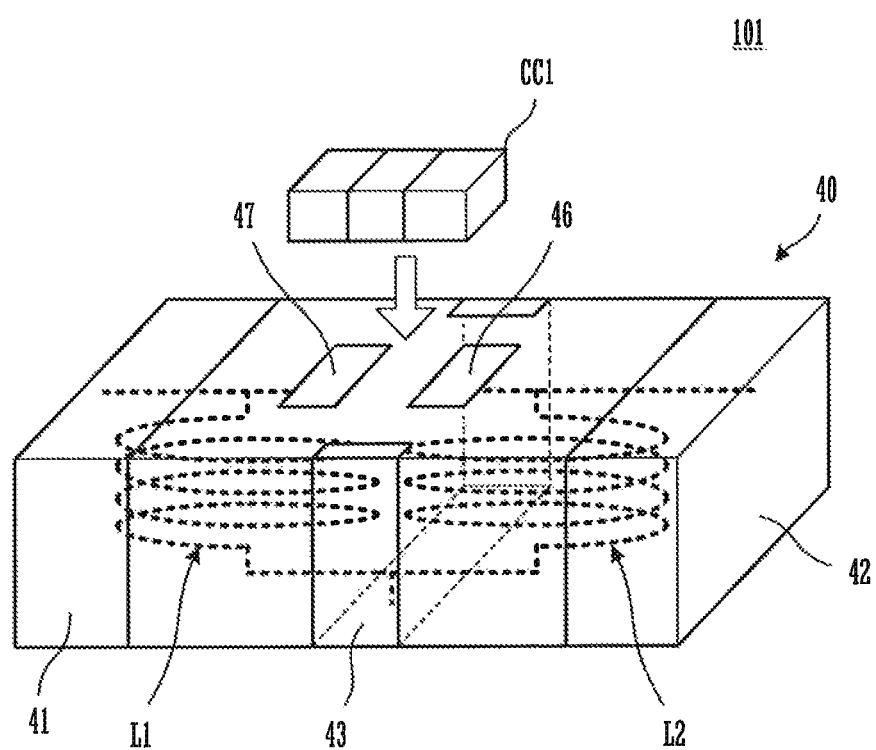
FIG. 4 is a perspective view of an impedance conversion module obtained by modularizing an impedance conversion circuit.

FIG. 4 is a perspective view of an impedance conversion module obtained by modularizing the impedance conversion circuit. This impedance conversion module 101 may preferably include a laminate 40 in which a plurality of dielectric layers or magnetic layers are laminated on each other and a chip capacitor CC1 mounted on this laminate 40.

The laminate 40 may be a resin multilayer substrate or may be a ceramic multilayer substrate. The pattern provided on the surface and the inside may preferably be defined by a Cu foil for a resin multilayer substrate; and a Cu thick film, an Ag thick film, or the like for a ceramic multilayer substrate.

The laminate may preferably include, on the outer surface, a first external terminal 41 as a feeding port, a second external terminal 42 as an antenna port, a third external terminal 43 connected to the ground (the second radiating element), and lands 46 and 47 that mount the chip capacitor CC1. The laminate 40 may also preferably include therein a primary side coil L1 and a secondary side coil L2 that are connected between the first external terminal 41 and the third external terminal 43, and these coils define a transformer.

It is to be noted, in place of mounting the chip capacitor CC1 on the upper surface of the laminate, a capacitor equivalent to the chip capacitor may be provided in the laminate 40. However, if a chip capacitor is mounted on the upper surface of the laminate 40, it is preferable in that the design and adjustment of a capacitance value are easily achieved.

Second Preferred Embodiment

Figure 5:
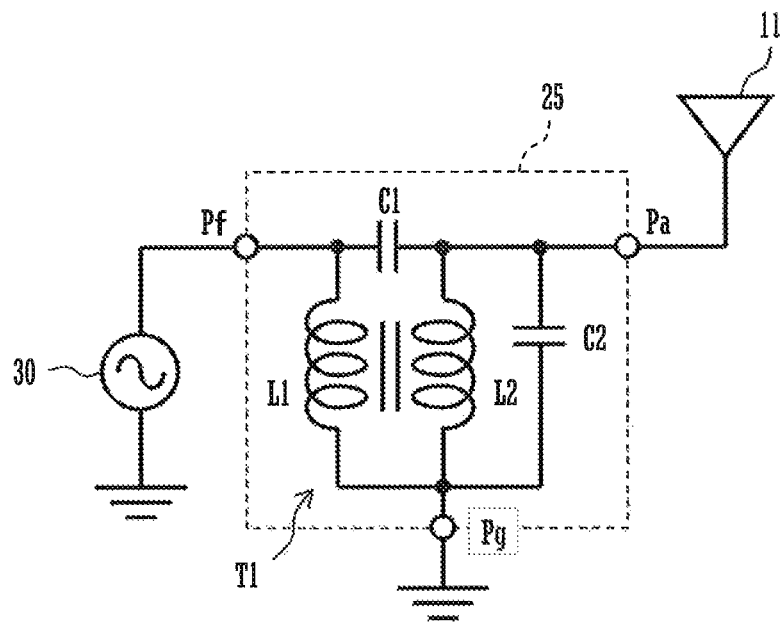
FIG. 5 is a circuit diagram of an impedance conversion circuit 25 according to a second preferred embodiment of the present invention and an antenna device 202 equipped with the impedance conversion circuit 25.

FIG. 5 is a circuit diagram of an impedance conversion circuit 25 according to a second preferred embodiment of the present invention and an antenna device 202 equipped with the impedance conversion circuit 25. As illustrated in FIG. 5, the antenna device 202 includes an antenna element 11 and an impedance conversion circuit 25 connected to the antenna element 11. The impedance conversion circuit 25 is inserted between the antenna element 11 and a high frequency circuit 30. Unlike the example illustrated in FIG. 1, a second capacitor C2 is connected in parallel to a secondary side coil L2. The other configurations are preferably the same or substantially the same as the configurations illustrated in FIG. 1.

In FIG. 5, the secondary side coil L2 and the second capacitor C2 define an LC parallel circuit. Therefore, by setting a parallel resonance frequency of this LC parallel circuit higher than a center frequency in a low band, the inductance of the LC parallel circuit in a low band is reduced. Thus, the impedance conversion ratio by a transformer is easily increased, so that the impedance conversion circuit 25 can be also applied to an antenna element having a lower impedance.

Third Preferred Embodiment

Figure 6A:
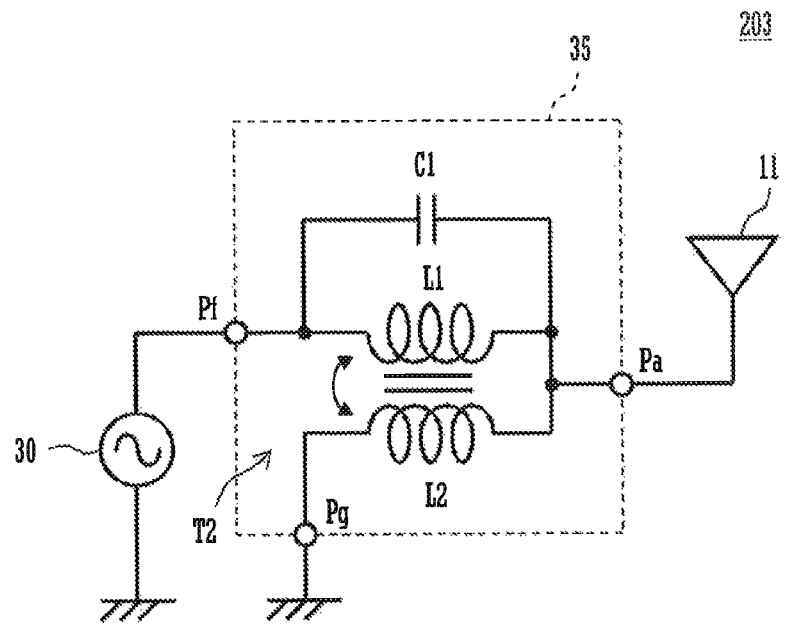
FIG. 6A is a circuit diagram of an impedance conversion circuit 35 according to a third preferred embodiment of the present invention and an antenna device 203 equipped with the impedance conversion circuit 35.
Figure 6B:
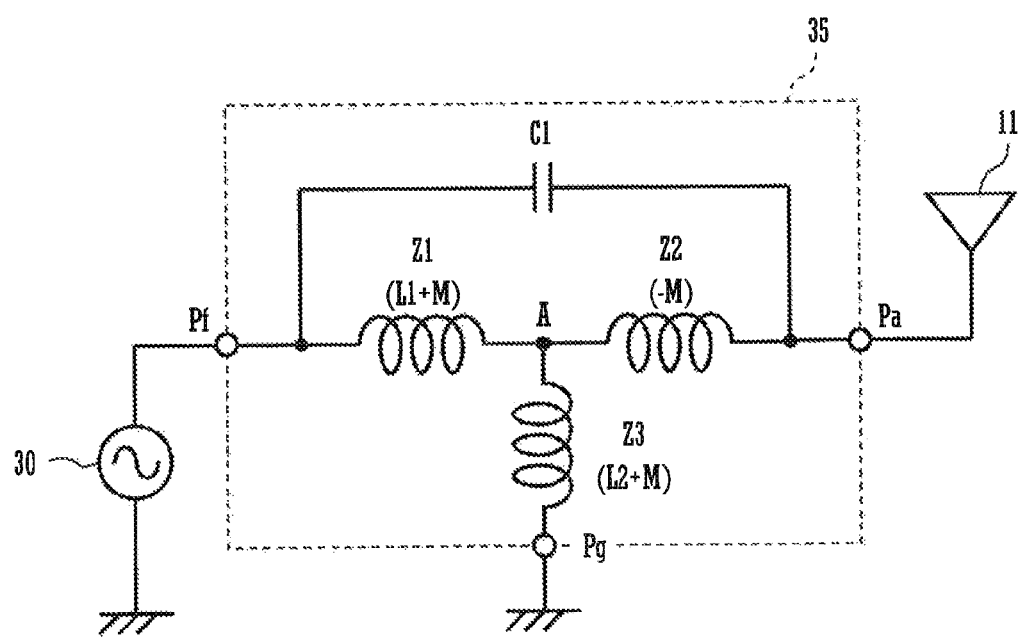
FIG. 6B is an equivalent circuit diagram of the antenna device 203.

FIG. 6A is a circuit diagram of an impedance conversion circuit 35 according to a third preferred embodiment of the present invention and an antenna device 203 equipped with the impedance conversion circuit 35. FIG. 6B is an equivalent circuit diagram of the antenna device 203. As illustrated in FIG. 6A, the antenna device 203 includes an antenna element 11 and an impedance conversion circuit 35 connected to the antenna element 11. The antenna element 11 is preferably a monopole antenna, for example, and the impedance conversion circuit 35 is connected to a feeding end of the antenna element 11. The impedance conversion circuit 35 is inserted between the antenna element 11 and a high frequency circuit 30. The high frequency circuit 30 is a high frequency circuit (a feeding circuit) that feeds a high-frequency signal to the antenna element 11, generates or processes the high-frequency signal, and may include a circuit that multiplexes and demultiplexes the high-frequency signal.

The impedance conversion circuit 35 includes a high frequency transformer T2 including a primary side coil L1 and a secondary side coil L2, and a capacitor C1. The primary side coil L1 is connected between a feeding port Pf and an antenna port Pa. Specifically, the first end of the primary side coil L1 is connected to the feeding port Pf, and the second end of the primary side coil L1 is connected to the antenna port Pa. The secondary side coil L2 is connected between the antenna port Pa and a ground port Pg. In other words, the first end of the secondary side coil L2 is connected to ground, and the second end of the secondary side coil L2 is connected to the antenna port Pa. In addition, the capacitor C1 is connected between the feeding port Pf and the antenna port Pa.

The transformer T2 can be, as illustrated in FIG. 6B, equivalently transformed into a T-type circuit including a first inductance element Z1 of inductance (L1+M), a second inductance element Z2 of inductance (−M), and a third inductance element Z3 of inductance (L2+M). Specifically, this T-type circuit is defined by the first inductance element Z1 connected between the feeding port Pf and a branch point A, the second inductance element Z2 connected between the antenna port Pa and the branch point A, and the third inductance element Z3 connected between the ground port Pg and the branch point A.

While, in the example illustrated in FIG. 1, the impedance conversion ratio of the transformer T1 is the ratio between the inductance of the primary side coil L1 and the inductance of the secondary side coil L2, in this configuration of FIG. 6, the impedance conversion ratio of the transformer T2 is:

$$\{(L1+M)+(L2+M)\}:\{(-M)+(L2+M)\}=(L1+L2+2M):L2.$$

In this way, according to the third preferred embodiment, the impedance conversion ratio is increased, so that the impedance conversion circuit 35 can be applied even to an antenna element having a lower impedance.

Fourth Preferred Embodiment

Figure 7:
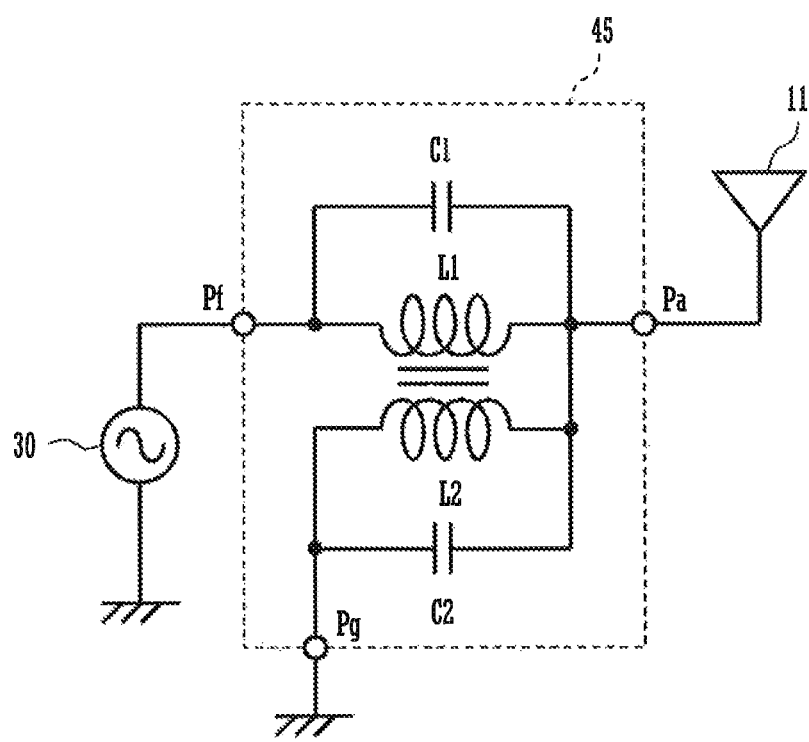
FIG. 7 is a circuit diagram of an impedance conversion circuit 45 according to a fourth preferred embodiment of the present invention and an antenna device 204 equipped with the impedance conversion circuit 45.

FIG. 7 is a circuit diagram of an impedance conversion circuit 45 according to a fourth preferred embodiment of the present invention and an antenna device 204 equipped with the impedance conversion circuit 45. As illustrated in FIG. 7, the antenna device 204 includes an antenna element 11 and an impedance conversion circuit 45 connected to the antenna element 11. The impedance conversion circuit 45 is inserted between the antenna element 11 and a high frequency circuit 30. Unlike the example illustrated in FIG. 6A, a second capacitor C2 is connected in parallel to a secondary side coil L2. The other configurations are preferably the same or substantially the same as the configurations illustrated in FIG. 6B.

In FIG. 7, the secondary side coil L2 and the second capacitor C2 define an LC parallel circuit. Therefore, by setting a parallel resonance frequency of the LC parallel circuit higher than a center frequency in a low band, the inductance of the LC parallel circuit in a low band is reduced. Thus, the impedance conversion ratio by a transformer is easily increased, so that the impedance conversion circuit can be also applied to an antenna element having a lower impedance.

Fifth Preferred Embodiment

Figure 8A:
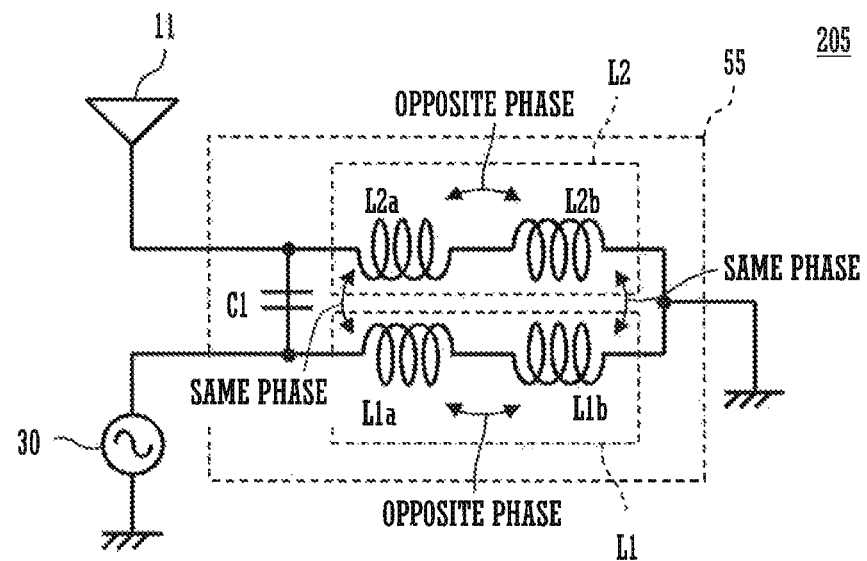
FIG. 8A is a circuit diagram of an antenna device 205 of a fifth preferred embodiment of the present invention.
Figure 8B:
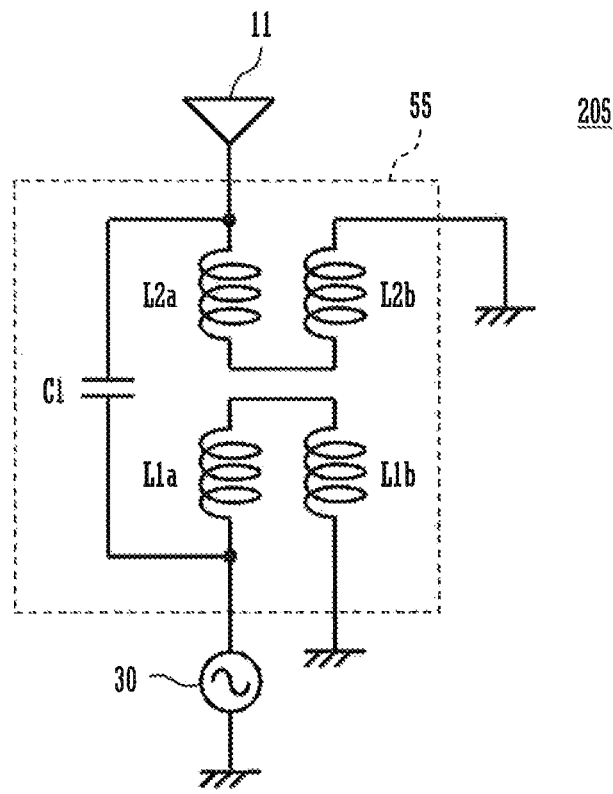
FIG. 8B is a view illustrating a specific arrangement of respective coil elements in the circuit.

FIG. 8A is a circuit diagram of an impedance conversion circuit 55 according to a fifth preferred embodiment of the present invention and an antenna device 205 equipped with the impedance conversion circuit 55. FIG. 8B is a view illustrating a specific arrangement of respective coil elements in the circuit. In the fifth preferred embodiment, a primary side coil and a secondary side coil are defined by two coil elements, respectively, and the primary side coil and the secondary side coil are coupled (tightly coupled) with a high coupling degree.

As illustrated in FIG. 8A, the primary side coil L1 includes a first coil element L1a and a second coil element L1b, which are connected in series to each other and are wound so as to define a closed magnetic circuit. In addition, the secondary side coil L2 includes a third coil element L2a and a fourth coil element L2b, which are connected in series to each other and are wound so as to define the closed magnetic circuit. In other words, the first coil element L1a and the second coil element L1b are coupled to each other in an opposite phase (additive polarity coupling) and the third coil element L2a and the fourth coil element L2b are coupled to each other in an opposite phase (additive polarity coupling.)

Furthermore, it is preferable that the first coil element L1a and the third coil element L2a are coupled to each other in the same phase (subtractive polarity coupling) and the second coil element L1b and the fourth coil element L2b are coupled to each other in the same phase (subtractive polarity coupling.)

Figure 9:
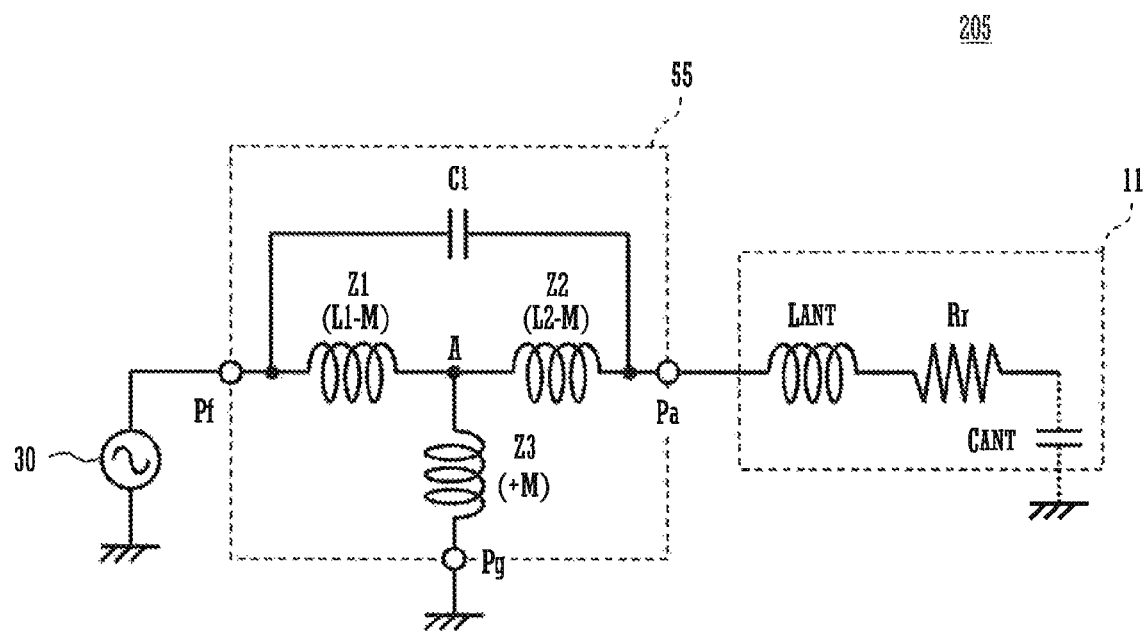
FIG. 9 is an equivalent circuit diagram of the antenna device 205.

FIG. 9 is an equivalent circuit diagram of the antenna device 205. As illustrated in FIG. 9, the antenna device 205 includes an antenna element 11 and an impedance conversion circuit 55 connected to this antenna element 11. The impedance conversion circuit 55 includes a transformer-type circuit in which the primary side coil L1 and the secondary side coil L2 are tightly coupled to each other through the mutual inductance M. The transformer-type circuit, as illustrated in FIG. 9, can be equivalently transformed into a T-type circuit including three inductance elements Z1, Z2, and Z3. Specifically, the T-type circuit is defined by a feeding port Pf connected to the high frequency circuit 30, an antenna port Pa connected to the antenna element 11, a ground port Pg connected to ground, a first inductance element Z1 connected between the feeding port Pf and a branch point A, a second inductance element Z2 connected between a second port P2 and the branch point A, and a third inductance element Z3 connected between a third port P3 and the branch point A.

As illustrated in FIG. 8A, an inductance of the primary side coil L1 is represented by L1, an inductance of the secondary side coil L2 is represented by L2, and a mutual inductance is represented by M. In this case, in FIG. 9, an inductance of the first inductance element Z1 can be expressed as L1−M, an inductance of the second inductance element Z2 can be expressed as L2-M, and an inductance of the third inductance element Z3 can be expressed as +M. If the relationship L2<M is satisfied, the inductance of the second inductance element Z2 has a negative value. In other words, an equivalent negative composite inductance component is generated in this case.

On the other hand, as shown in FIG. 9, the antenna element 11 is equivalently defined by an inductance component LANT, a radiation resistance component Rr, and a capacitance component CANT. The inductance component LANT of the antenna element 11 alone acts so as to be canceled by the negative composite inductance component (L2−M) in the impedance conversion circuit 55. In other words, the inductance component (of the antenna element 11 including the second inductance element Z2), when the antenna element 11 side is viewed from a point A in the impedance conversion circuit, is reduced (ideally, to zero), and consequently, the impedance frequency characteristic of the antenna device 205 is reduced.

In order to generate a negative inductance component in the manner described above, it is important to cause the primary side coil and the secondary side coil to be coupled to each other with a high degree of coupling. Specifically, this degree of coupling may be preferably 1 or greater.

Figure 10:
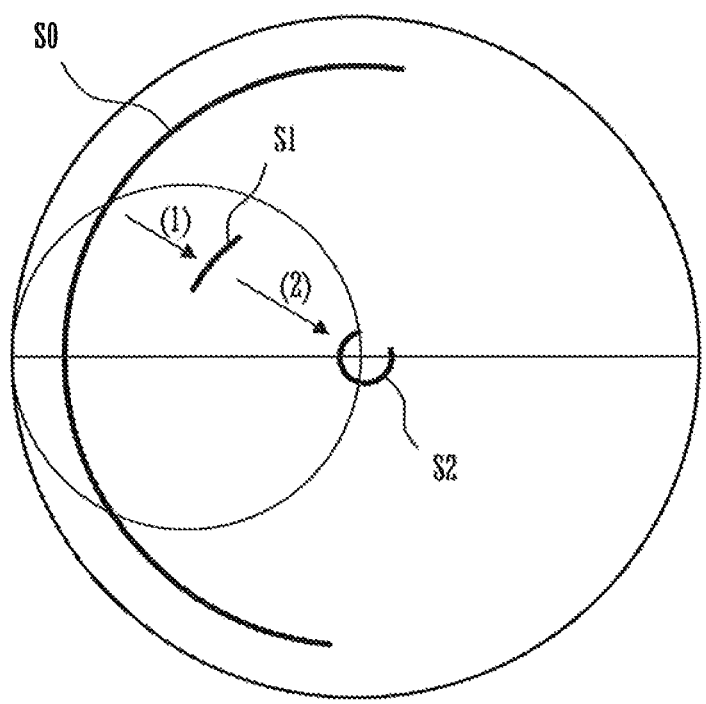
FIG. 10 is a view schematically illustrating an effect of a negative inductance component generated in the impedance conversion circuit 45 in an equivalent manner and an effect of the impedance conversion circuit 45.

FIG. 10 is a view schematically illustrating an effect of a negative inductance component generated in the impedance conversion circuit 55 in an equivalent manner and an effect of the impedance conversion circuit 55. In FIG. 10, a curve S0 represents, on a Smith chart, an impedance trace obtained by sweeping the frequency over a frequency band used by the antenna element 11. Since the inductance component LANT of the antenna element 11 alone is relatively large, the impedance significantly changes as illustrated in FIG. 10.

In FIG. 10, a curve S1 represents an impedance trace when the antenna element 11 side is viewed from a point A in the impedance conversion circuit. As illustrated, the equivalent negative inductance component of the impedance conversion circuit cancels the inductance component LANT of the antenna element, so that the impedance trace as viewed from the point A to the antenna element side is significantly reduced.

In FIG. 10, a curve S2 represents a trace of impedance, i.e., impedance of the antenna device 205, as viewed from the high frequency circuit 30. In this way, in accordance with the impedance conversion ratio (L1:L2) of the transformer-type circuit, the impedance of the antenna device 205 approaches 50Ω (the center of the Smith chart), for example. It should be noted that the impedance may be finely adjusted by adding an inductance element and/or a capacitance element to the transformer-type circuit.

In this way, changes in impedance of the antenna device are prevented or significantly reduced over a wide band. Therefore, it is possible to provide impedance matching between the feeding circuit and the antenna device over a wide frequency band.

Sixth Preferred Embodiment

Figure 11A:
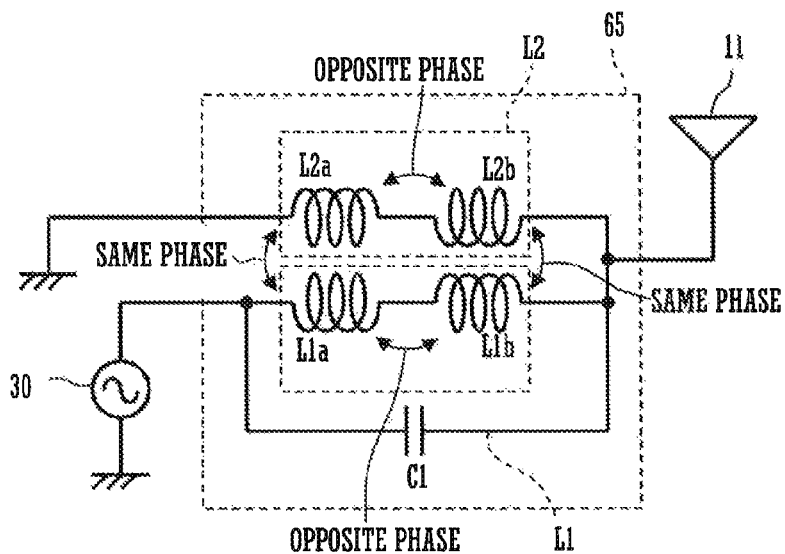
FIG. 11A is a circuit diagram of an antenna device 206 of a sixth preferred embodiment of the present invention.
Figure 11B:
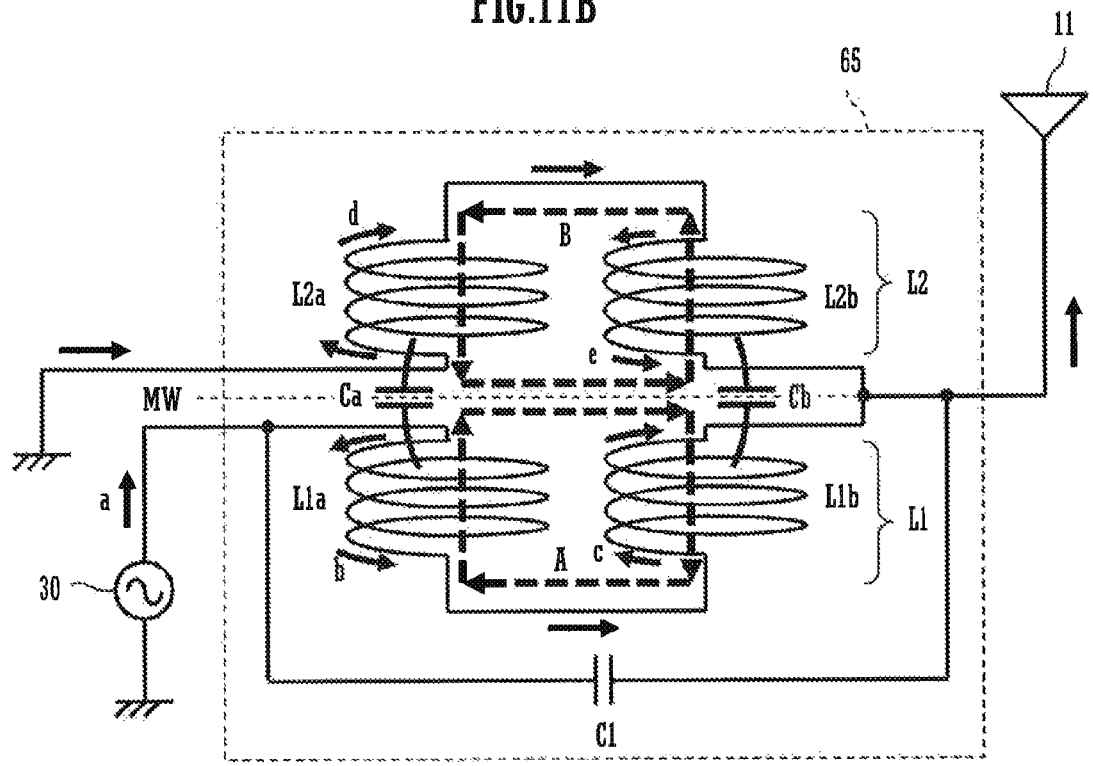
FIG. 11B is a view illustrating a specific arrangement of respective coil elements in the circuit.

FIG. 11A is a circuit diagram of an antenna device 206 of a sixth preferred embodiment of the present invention. FIG. 11B is a view illustrating a specific arrangement of respective coil elements in the circuit. The sixth preferred embodiment is, while the basic configuration is preferably similar to the configuration of the third preferred embodiment, an example in which a primary side coil and a secondary side coil are defined by two coil elements, respectively, and the primary side coil and the secondary side coil are coupled (tightly coupled) with a high coupling degree.

As illustrated in FIG. 11A, the primary side coil L1 is defined by a first coil element L1a and a second coil element L1b, which are connected in series to each other and are wound so as to define a closed magnetic circuit. In addition, the secondary side coil L2 is defined by a third coil element L2a and a fourth coil element L2b, which are connected in series to each other and are wound so as to define a closed magnetic circuit. In other words, the first coil element L1a and the second coil element L1b are coupled to each other in an opposite phase (additive polarity coupling) and the third coil element L2a and the fourth coil element L2b are coupled to each other in an opposite phase (additive polarity coupling.)

Furthermore, it is preferable that the first coil element L1a and the third coil element L2a are coupled to each other in the same phase (subtractive polarity coupling) and the second coil element L1b and the fourth coil element L2b be coupled to each other in the same phase (subtractive polarity coupling.)

As illustrated in FIG. 11B, when a current is supplied from the feeding circuit in a direction indicated by arrow a in the figure, a current flows in the first coil element L1a in a direction indicated by arrow b in the figure and also a current flows in the coil element L1b in a direction indicated by arrow c in the figure. Then, these currents generate a magnetic flux (a magnetic flux passing through a closed magnetic circuit), as indicated by arrow A in the figure.

Since the coil element L1a and the coil element L2a are parallel or substantially parallel to each other, a magnetic field generated as a result of flowing of the current b in the coil element L1a is coupled to the coil element L2a and thus an induced current d flows in the coil element L2a in an opposite direction. Similarly, since the coil element L1b and the coil element L2b are parallel or substantially parallel to each other, a magnetic field generated as a result of flowing of the current c in the coil element L1b is coupled to the coil element L2b and thus an induced current e flows in the coil element L2b in an opposite direction. Then, these currents generate a magnetic flux passing through a closed magnetic circuit, as indicated by arrow B in the figure.

Since the closed magnetic circuit of the magnetic flux A generated in the primary side coil L1, including the coil elements L1a and L1b, and the closed magnetic circuit of the magnetic flux B generated in the secondary side coil L2, including the coil elements L2a and L2b, are independent of each other, an equivalent magnetic barrier MW is generated between the primary side coil L1 and the secondary side coil L2.

In addition, the coil element L1a and the coil element L2a are also coupled to each other through an electric field. Similarly, the coil element L1b and the coil element L2b are coupled to each other through an electric field. Accordingly, when alternating-current signals flow in the coil element L1a and the coil element L1b, electric-field coupling causes currents to be excited in the coil element L2a and the coil element L2b. Capacitors Ca and Cb in FIG. 11B symbolically indicate coupling capacitances for the electric-field coupling.

When an alternating current flows in the primary side coil L1, the direction of a current flowing in the secondary side coil L2 as a result of the coupling through the magnetic field and the direction of a current flowing in the secondary side coil L2 as a result of the coupling through the electric field are the same. Accordingly, the primary side coil L1 and the secondary side coil L2 are strongly coupled to each other through both the magnetic field and the electric field.

The impedance conversion circuit 65 may also be defined as a circuit configured such that, when an alternating current flows in the primary side coil L1, a direction of a current that flows in the secondary side coil L2 as a result of coupling through a magnetic field is the same as a direction of a current that flows in the secondary side coil L2 as a result of coupling through an electric field.

Seventh Preferred Embodiment

Figure 12:
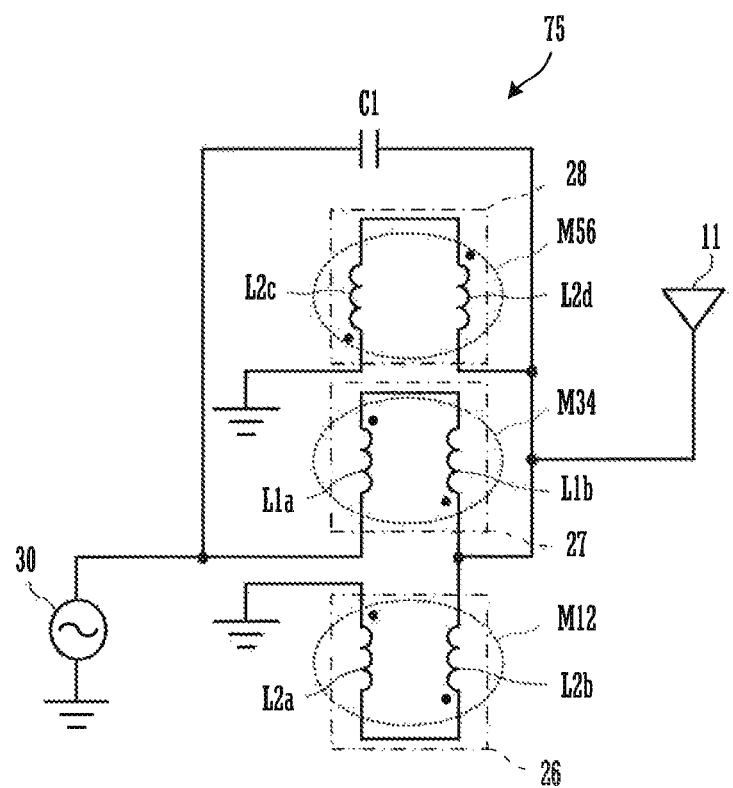
FIG. 12 is a circuit diagram of an antenna device 207 equipped with an impedance conversion circuit 75 according to a seventh preferred embodiment of the present invention.

FIG. 12 is a circuit diagram of an antenna device 207 equipped with an impedance conversion circuit 75 according to a seventh preferred embodiment of the present invention. This impedance conversion circuit 75 is defined by a second series circuit 27 connected between a high frequency circuit 30 and an antenna element 11, and first and third series circuits 26 and 28 connected between the antenna element 11 and ground.

The second series circuit 27 is a circuit in which a first coil element L1a and a second coil element L1b are connected in series. The first series circuit 26 is a circuit in which a third coil element L2a and a fourth coil element L2b are connected in series. The third series circuit 28 is a circuit in which another third coil element L2c and another fourth coil element L2d are connected in series.

In FIG. 12, a dashed line M34 indicates coupling between the coil elements L1a and L1b, a dashed line M12 indicates coupling between the coil elements L2a and L2b, and a dashed line M56 indicates coupling between the coil elements L2c and L2d, respectively.

Figure 13:
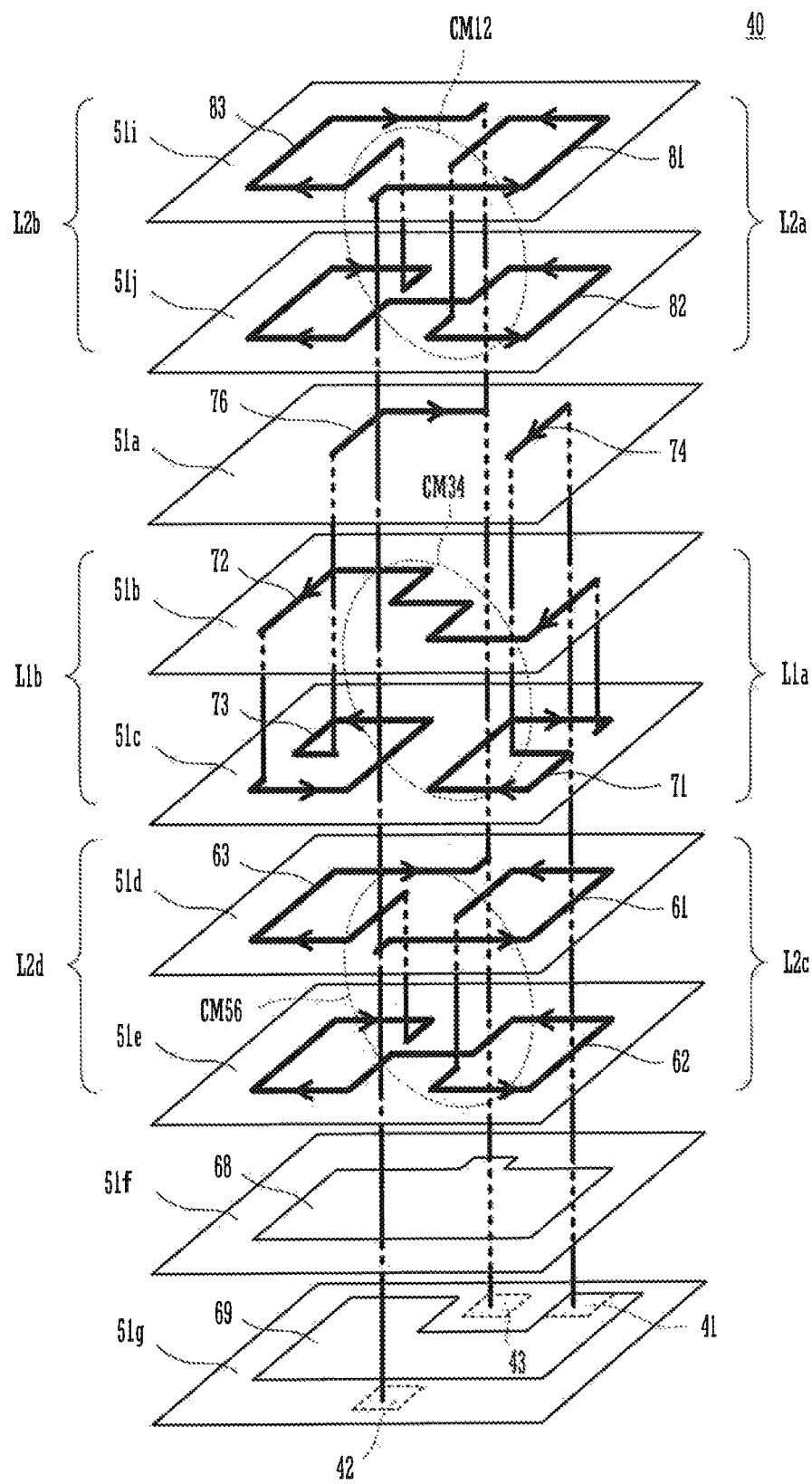
FIG. 13 is a view illustrating an example of conductor patterns of individual layers when the impedance conversion circuit according to the seventh preferred embodiment of the present invention is configured in a multilayer substrate.

FIG. 13 is a view illustrating an example of conductor patterns of individual layers when an impedance conversion circuit according to the seventh preferred embodiment of the present invention is configured in a multilayer substrate. Each layer of the laminate is preferably defined by a magnetic sheet and a conductor pattern is provided on the each layer.

In the area illustrated in FIG. 13, conductor patterns 81 and 83 are provided on the base material layer 51*i*, a conductor pattern 82 is provided on the base material layer 51*j*, and conductor patterns 74 and 76 are provided on the base material layer 51*a*. A conductor pattern 72 is provided on the base material layer 51*b*, and conductor patterns 71 and 73 are provided on the base material layer 51*c*. Conductor patterns 61 and 63 are provided on the base material layer 51*d*, a conductor pattern 62 is provided on the base material layer 51*e*, and a conductor 68 for a capacitor is provided on the base material layer 51*f*. The base material layer 51*g* includes a conductor 69 for a capacitor on the upper surface; and a feeding terminal 41 as a terminal port, a ground terminal 42, and an antenna terminal 43 as an antenna port on the lower surface, respectively. Dashed lines extending vertically in FIG. 13 represent via electrodes that provide inter-layer connections between the corresponding conductor patterns.

In FIG. 13, the right half of the conductor pattern 72, and the conductor pattern 71 define the first coil element L1a. The left half of the conductor pattern 72, and the conductor pattern 73 define the second coil element L1b. The conductor pattern 81 and the right half of the conductor pattern 82 define the third coil element L2a. The left half of the conductor pattern 82, and the conductor pattern 83 define the fourth coil element L2b. The conductor pattern 61 and the right half of the conductor pattern 62 define another third coil element L2c. The left half of the conductor pattern 62, and the conductor pattern 63 define another fourth coil element L2d. The conductor 68 for a capacitor and the conductor 69 for a capacitor generate a capacitor C1 illustrated in FIG. 12.

In FIG. 13, ellipses indicated by a dashed line represent closed magnetic circuits. A closed magnetic circuit CM12 interlinks with the coil elements L2a and L2b. In addition, a closed magnetic circuit CM34 interlinks with the coil elements L1a and L1b. Furthermore, a closed magnetic circuit CM56 interlinks with the coil elements L2c and L2d. In this way, the first closed magnetic circuit CM12 is defined by the third coil element L2a and the fourth coil element L2b, the second closed magnetic circuit CM34 is defined by the first coil element L1a and the second coil element L1b, and the third closed magnetic circuit CM56 is defined by the third coil element L2c and the fourth coil element L2d.

In FIG. 13, since the magnetic fluxes of the closed magnetic circuits CM12 and CM34 repel each other, a magnetic barrier is generated between the closed magnetic circuits CM12 and CM34. Similarly, since the magnetic fluxes of the closed magnetic circuits CM56 and CM34 repel each other, a magnetic barrier is generated between the closed magnetic circuits CM56 and CM34. These two magnetic barriers confine the magnetic fluxes of the closed magnetic circuits CM12, CM34, and CM56, respectively.

As described above, the second closed magnetic circuit CM34 is structured to be sandwiched between the first closed magnetic circuit CM12 and the third closed magnetic circuit CM56 in the lamination direction. With this structure, the second closed magnetic circuit CM34 is sandwiched by the two magnetic barriers and is sufficiently confined (the effect of being confined is enhanced.) In other words, it is possible to cause the impedance conversion circuit to act as a transformer having a very large coupling coefficient.

Accordingly, the distance between the closed magnetic circuits CM12 and CM34 and the distance between the closed magnetic circuits CM34 and CM56 is increased to an extent. This makes it possible to reduce the capacitance generated between the first series circuit 26 and the second series circuit 27 as illustrated in FIG. 13, and the capacitance generated between the second series circuit 27 and the third series circuit 28 as also illustrated in FIG. 13. In other words, the capacitance component of an LC resonant circuit that defines the frequency of a self-resonant point is reduced.

In addition, according to the seventh preferred embodiment, since the first series circuit 26 defined by the coil elements L2a and L2b and the third series circuit 28 defined by the coil elements L2c and L2d are connected in parallel to each other, the inductance component of an LC resonant circuit that defines the frequency of the self-resonant point is reduced.

In this way, both the capacitance component and the inductance component of the LC resonant circuit that defines the frequency of the self-resonant point are reduced, so that the frequency of the self-resonant point can be set to a high frequency that is sufficiently far from a usage frequency band.

In the seventh preferred embodiment, the primary side coils (L1a and L1b) are arranged so as to be sandwiched by the second inductance elements (L2a, L2b, L2c, and L2d), which suppresses stray capacitance generated between the primary side coils (L1a and L1b) and ground. By suppressing such capacitance component that does not contribute to radiation, the radiation efficiency of the antenna is enhanced.

In addition, the primary side coils (L1a and L1b) and the secondary side coils (L2a, L2b, L2c, and L2d) are more tightly coupled, that is, the leakage magnetic field is reduced, so that the energy transmission loss of high-frequency signals between the primary side coils (L1a and L1b) and the secondary side coils (L2a, L2b, L2c, and L2d) is reduced.

Eighth Preferred Embodiment

Figure 14:
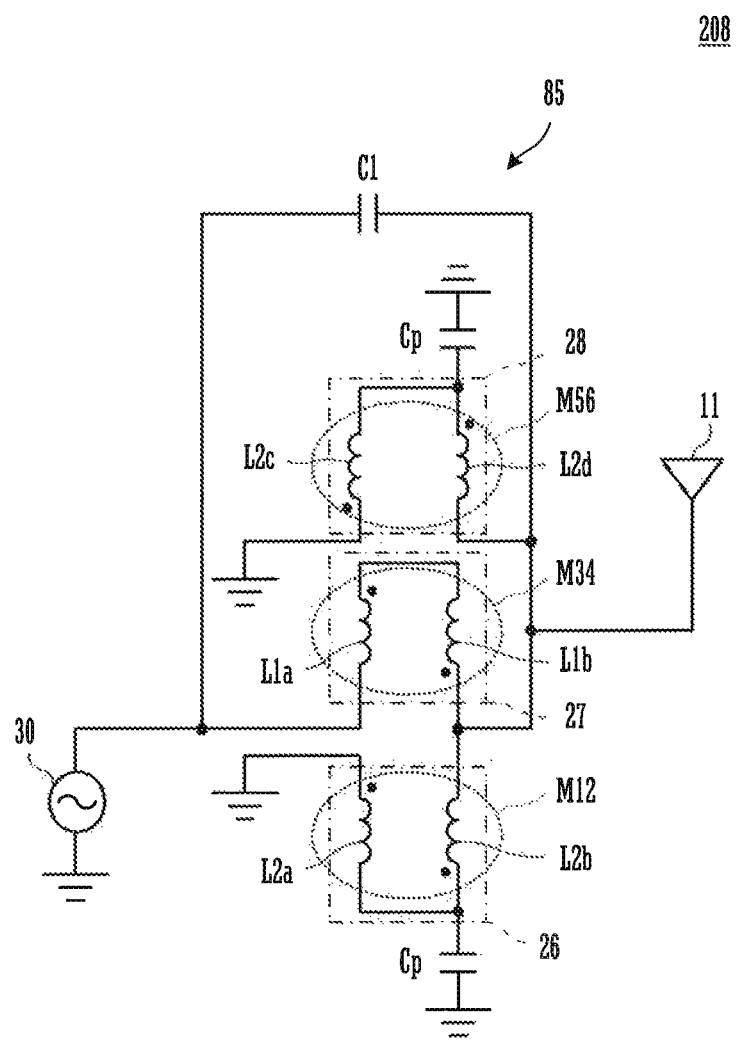
FIG. 14 is a circuit diagram of an antenna device 208 equipped with an impedance conversion circuit 85 according to an eighth preferred embodiment of the present invention.

FIG. 14 is a circuit diagram of an antenna device 208 equipped with an impedance conversion circuit 85 according to an eighth preferred embodiment of the present invention. This impedance conversion circuit 85 is defined by a second series circuit 27 connected between a feeding circuit 30 and an antenna element 11, and first and third series circuits 26 and 28 connected between the antenna element 11 and ground.

The second series circuit 27 is a circuit in which a first coil element L1a and a second coil element L1b are connected in series. The first series circuit 26 is a circuit in which a third coil element L2a and a fourth coil element L2b are connected in series. The third series circuit 28 is a circuit in which another third coil element L2c and another fourth coil element L2d are connected in series.

In FIG. 14, a dashed line M34 indicates coupling between the coil elements L1a and L1b, a dashed line M12 indicates coupling between the coil elements L2a and L2b, and a dashed line M56 indicates coupling between the coil elements L2c and L2d, respectively.

The series circuit defined by the third coil element L2a and the fourth coil element L2b, and the series circuit defined by the third coil element L2c and the fourth coil element L2d include parallel capacitance Cp.

In this way, by adding a parallel capacitance component to the secondary side coil, the impedance conversion ratio of the transformer circuit has a frequency characteristic.

Figure 15:
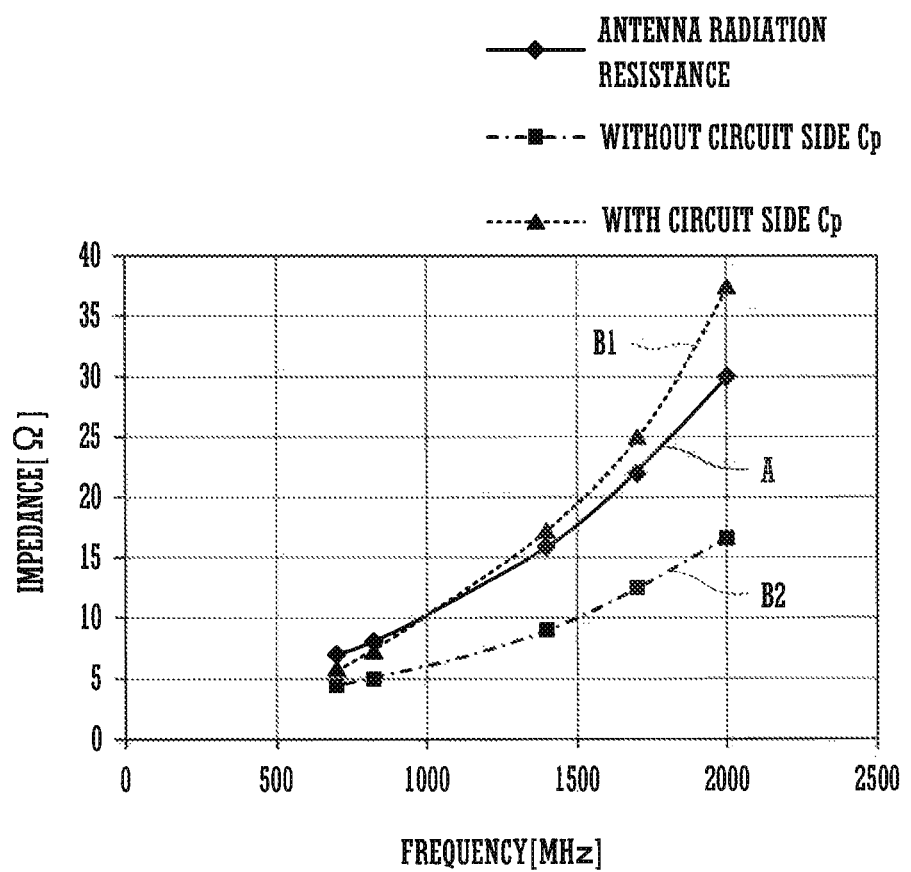
FIG. 15 is a view illustrating a frequency characteristic of a real part (a resistance component) of the impedance of the impedance conversion circuit 85 as viewed from an antenna port.

FIG. 15 is a view illustrating a frequency characteristic of a real part (a resistance component) of the impedance of the impedance transformation circuit 85 as viewed from an antenna port. In FIG. 15, A represents a radiation resistance of the antenna, B1 represents a real part of the impedance of the impedance conversion circuit 85 in a case in which the capacitance Cp is included in the circuit, B2 represents a real part of the impedance of the impedance conversion circuit 85 in a case in which no capacitance Cp is included in the circuit. In the case in which Cp is included in the circuit, the frequency characteristic of a real part Rc of the impedance of the impedance conversion circuit 85 can be equivalent to the frequency characteristic of a radiation resistance Rr of the antenna, indicating a high frequency circuit and an antenna element can be matched in a wide frequency band.

Figure 16:
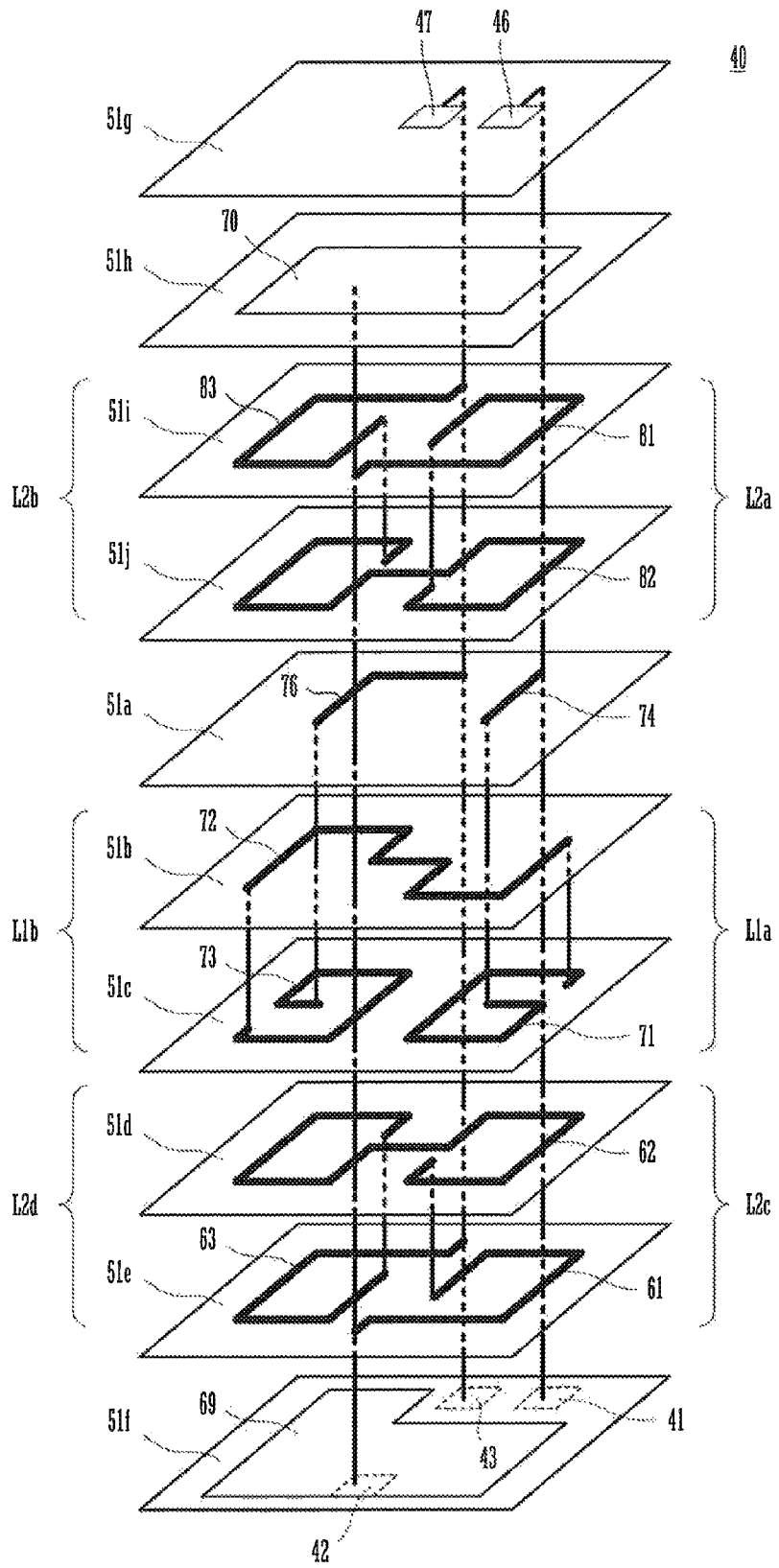
FIG. 16 is a view illustrating an example of conductor patterns of individual layers when the impedance conversion circuit according to the eighth preferred embodiment of the present invention is configured in a multilayer substrate.

FIG. 16 is an exploded perspective view of a laminate 40 that defines the impedance conversion circuit included in the antenna device according to the eighth preferred embodiment. Each layer of the laminate is preferably defined by a magnetic sheet and a conductor pattern is provided on the each layer.

In the area illustrated in FIG. 16, conductor patterns 81 and 83 are provided on the base material layer 51*i*, a conductor pattern 82 is provided on the base material layer 51*j*, and conductor patterns 74 and 76 are provided on the base material layer 51*a*. A conductor pattern 72 is provided on the base material layer 51*b*, and conductor patterns 71 and 73 are provided on the base material layer 51*c*. A conductor pattern 62 is provided on the base material layer 51*d*, and conductor patterns 61 and 63 are provided on the base material layer 51*e*. The base material layer 51*f* includes a ground conductor 69 on the upper surface; and a feeding terminal 41 as a feeding port, aground terminal 42, and an antenna terminal 43 as an antenna port on the lower surface, respectively. A base material layer 51*h* includes a ground conductor 70. On the upper surface of the base material layer 51*g*, electrodes 46 and 47 that mount the chip capacitor as the capacitor C1 illustrated in FIG. 14 are provided.

Dashed lines extending vertically in FIG. 16 represent via electrodes that provide inter-layer connections between the corresponding conductor patterns.

In FIG. 16, the right half of the conductor pattern 72, and the conductor pattern 71 define the first coil element L1a. The left half of the conductor pattern 72, and the conductor pattern 73 define the second coil element L1b. The conductor pattern 81 and the right half of the conductor pattern 82 define the third coil element L2a. The left half of the conductor pattern 82, and the conductor pattern 83 define the fourth coil element L2b. The conductor pattern 61 and the right half of the conductor pattern 62 define another third coil element L2c. The left half of the conductor pattern 62, and the conductor pattern 63 define another fourth coil element L2d.

The ground conductor 69 and the conductor patterns 61 and 63 face each other, and a capacitance is generated particularly between the conductor pattern 63 and the ground conductor 69. Similarly, the ground conductor 70 and the conductor patterns 81 and 83 face each other, and a capacitance is generated particularly between the conductor pattern 83 and the ground conductor 70. The capacitance corresponds to the parallel capacitance Cp illustrated in FIG. 14.

It should be noted, as in the eighth preferred embodiment, the structure in which the various conductor patterns provided on the plurality of layers are vertically sandwiched by the ground conductors 69 and 70 suppresses or prevents undesired coupling with an external conductor or a circuit even when the entire laminate 40 is made thin, which makes it possible to obtain stable characteristic and also to reduce the thickness of the antenna. In addition, by providing the ground conductor 70 on an upper layer of the laminate, the impedance conversion characteristic is not affected even when surface mounted devices such as the chip capacitor CC1 are mounted on the upper surface of the laminate 40. This makes it possible to mount various chip components in the laminate and define a module component.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An impedance conversion circuit for use in an antenna device that transmits and receives a high-frequency signal in a frequency band including a first frequency band and a second frequency band of which the second frequency band is higher than the first frequency band, the impedance conversion circuit comprising:
   a transformer that includes a primary side coil and a secondary side coil and is connected between a feeding port and an antenna port; and
   a first capacitor that is connected between the feeding port and the antenna port; wherein
   an absolute value of impedance of the first capacitor in the first frequency band is larger than an absolute value of impedance of the primary side coil;
   an absolute value of impedance of the first capacitor in the second frequency band is smaller than the absolute value of the impedance of the primary side coil;
   the primary side coil includes a first end connected to the feeding port;
   the primary side coil includes a second end connected to the antenna port;
   the secondary side coil includes a first end connected to ground;
   the secondary side coil includes a second end connected to the antenna port; and
   the first capacitor is connected between the first end of the primary side coil and the second end of the secondary side coil.

2. The impedance conversion circuit according to claim 1, further comprising a second capacitor provided to the secondary side coil in parallel.

3. The impedance conversion circuit according to claim 1, wherein:
   the primary side coil and the secondary side coil of the transformer are integrally configured in a multilayer substrate as a laminate including a plurality of dielectric layers or magnetic layers;
   a first external terminal as the feeding port and a second external terminal as the antenna port are provided on a surface of the laminate; and
   at least the first capacitor is provided on a surface or an inside of the laminate.

4. A communication terminal apparatus including an antenna device that transmits and receives a high-frequency signal in a frequency band including a first frequency band and a second frequency band of which the second frequency band is higher than the first frequency band, the communication terminal apparatus comprising:
   an impedance conversion circuit including:
      a transformer that is connected between a feeding port and an antenna port and includes a primary side coil and a secondary side coil; and
      a capacitor that is connected between the feeding port and the antenna port; wherein
   an absolute value of impedance of the capacitor in the first frequency band is larger than an absolute value of impedance of the primary side coil;

an absolute value of impedance of the capacitor in the second frequency band is smaller than the absolute value of the impedance of the primary side coil;

the primary side coil includes a first end connected to the feeding port;

the primary side coil includes a second end connected to the antenna port;

the secondary side coil includes a first end connected to ground;

the secondary side coil includes a second end connected to the antenna port; and the first capacitor is connected between the first end of the primary side coil and the second end of the secondary side coil.

5. The communication terminal apparatus according to claim 4, further comprising a second capacitor provided to the secondary side coil in parallel.

6. The communication terminal apparatus according to claim 4, wherein:

the primary side coil and the secondary side coil of the transformer are integrally configured in a multilayer substrate as a laminate including a plurality of dielectric layers or magnetic layers;

a first external terminal as the feeding port and a second external terminal as the antenna port are provided on a surface of the laminate; and at least the first capacitor is provided on a surface or an inside of the laminate.

7. The communication terminal apparatus according to claim 4, wherein the communication terminal apparatus is one of a phone and a mobile terminal.

8. The communication terminal apparatus according to claim 4, further comprising a high frequency circuit, wherein the impedance conversion circuit is located between the antenna element and the high frequency circuit.

9. The communication terminal apparatus according to claim 8, wherein the high frequency circuit includes a signal processing circuit that is one of an RF circuit and a baseband circuit.

10. The communication terminal apparatus according to claim 4, wherein the antenna element includes a first radiating element defined by one of a chip antenna, a sheet-metal antenna, a coil antenna, and a linear conductor.

11. The communication terminal apparatus according to claim 10, further comprising a second radiating element defining a ground plate for a casing.

12. The communication terminal apparatus according to claim 4, further comprising a first casing and a second casing arranged in a flipping or sliding relationship relative to each other.

13. The communication terminal apparatus according to claim 12, wherein the first casing includes a first radiating element defining a ground plate and the second casing includes a second radiating element defining a ground plate.

14. The communication terminal apparatus according to claim 4, wherein the antenna element is a monopole antenna.

* * * * *